United States Patent
Kim et al.

(10) Patent No.: US 12,240,699 B2
(45) Date of Patent: Mar. 4, 2025

(54) ARTICLE STORAGE DEVICE, METHOD OF CALCULATING SETTING VALUE IN ORDER OF PRIORITY OF THE ARTICLE STORAGE DEVICE, AND METHOD OF STORING ARTICLE USING THE SAME

(71) Applicant: SEMES CO., LTD., Cheonan-si (KR)

(72) Inventors: Young Woo Kim, Cheonan-si (KR); Jin Ho Song, Seongnam-si (KR); Yong Bae Choi, Seoul (KR); Ji Hyun Park, Daegu (KR)

(73) Assignee: SEMES CO., LTD., Cheonan-si (KR)

( * ) Notice: Subject to any disclaimer, the term of this patent is extended or adjusted under 35 U.S.C. 154(b) by 928 days.

(21) Appl. No.: 17/349,467

(22) Filed: Jun. 16, 2021

(65) Prior Publication Data
US 2021/0395010 A1     Dec. 23, 2021

(30) Foreign Application Priority Data
Jun. 23, 2020   (KR) .................. 10-2020-0076686

(51) Int. Cl.
*B65G 1/137*     (2006.01)
*B25J 13/08*     (2006.01)

(52) U.S. Cl.
CPC ............ *B65G 1/137* (2013.01); *B25J 13/089* (2013.01)

(58) Field of Classification Search
CPC .... G07F 11/165; G07F 11/62; G07F 17/0092; B65G 1/137; B65G 2201/0297; G06Q 10/08; G06Q 20/18; G06Q 10/087
See application file for complete search history.

(56) References Cited

U.S. PATENT DOCUMENTS

| 10,007,764 B2 * | 6/2018 | Kim ................... G07F 17/0092 |
| 2015/0198942 A1 * | 7/2015 | Chen ................ G05B 19/41865 |
| | | 700/112 |

FOREIGN PATENT DOCUMENTS

| JP | 2005-206272 | | 8/2005 |
| JP | 2005206272 A | * | 8/2005 |
| JP | 2013-052993 | | 3/2013 |
| KR | 10-2006-0072943 | | 6/2006 |
| KR | 10-2020-0050130 | | 5/2020 |

OTHER PUBLICATIONS

Chinese Office Action with Summary in English for Chinese Patent Application No. 202110690789.8, dated Nov. 25, 2022.
Korean Office Action with English translation for Korean Patent Application No. 10-2020-0076686, dated May 17, 2023.

* cited by examiner

*Primary Examiner* — Timothy R Waggoner
(74) *Attorney, Agent, or Firm* — KILE PARK REED & HOUTTEMAN PLLC

(57) ABSTRACT

An article storage device includes a load port configured to load and unload a plurality of articles, a plurality of shelves configured to load the articles, a transportation robot configured to transport the articles between the load port and the shelves or between the shelves, a receiving part configured to receive operation commands of the transportation robot from an upper system, a calculating part configured to calculate a setting value of an order of priority with respect to the operation commands, and a control part configured to control the transportation robot to perform an operation command having a high setting value of an order of priority among the operation commands.

19 Claims, 4 Drawing Sheets

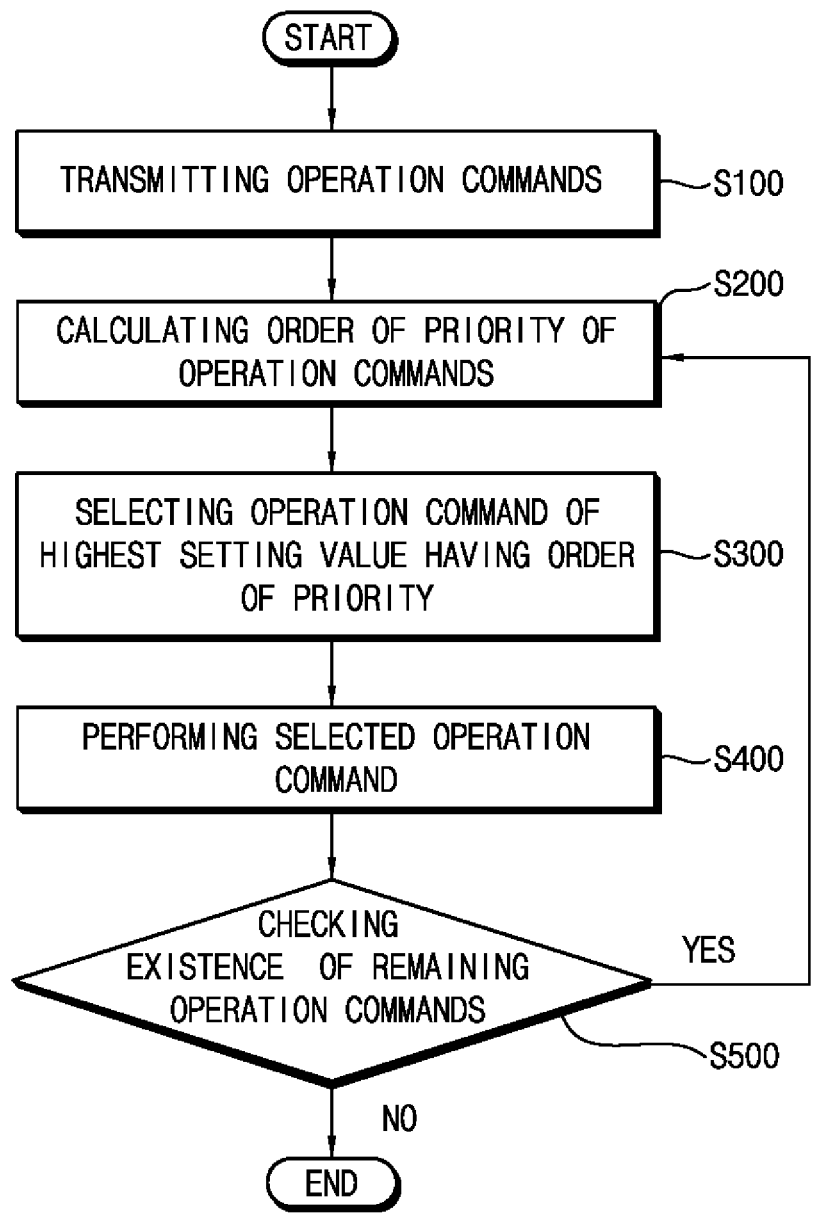

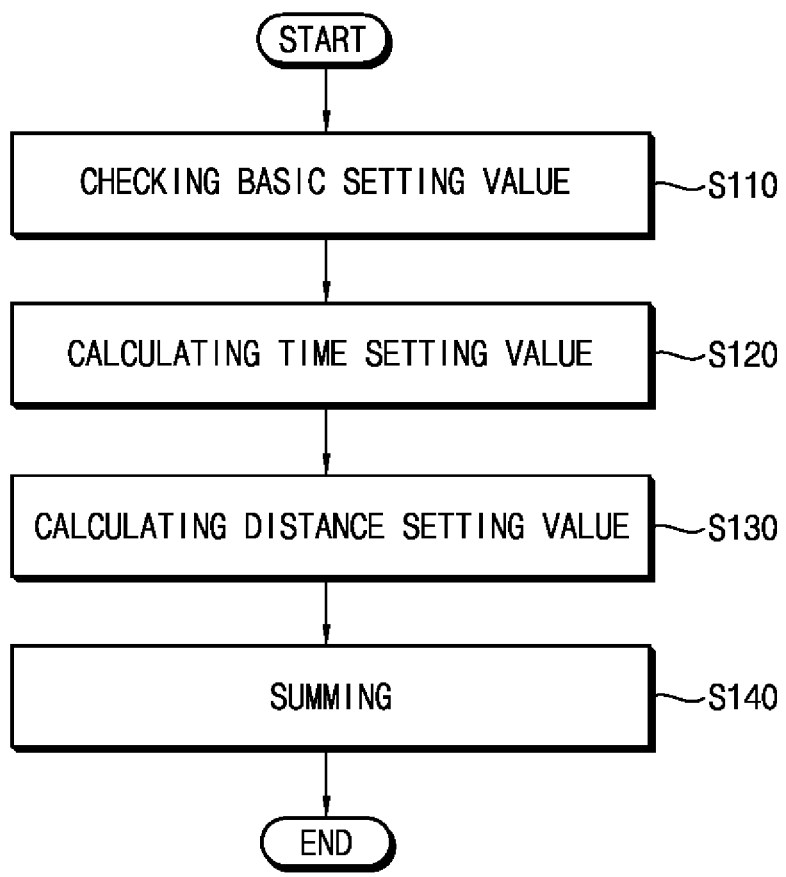

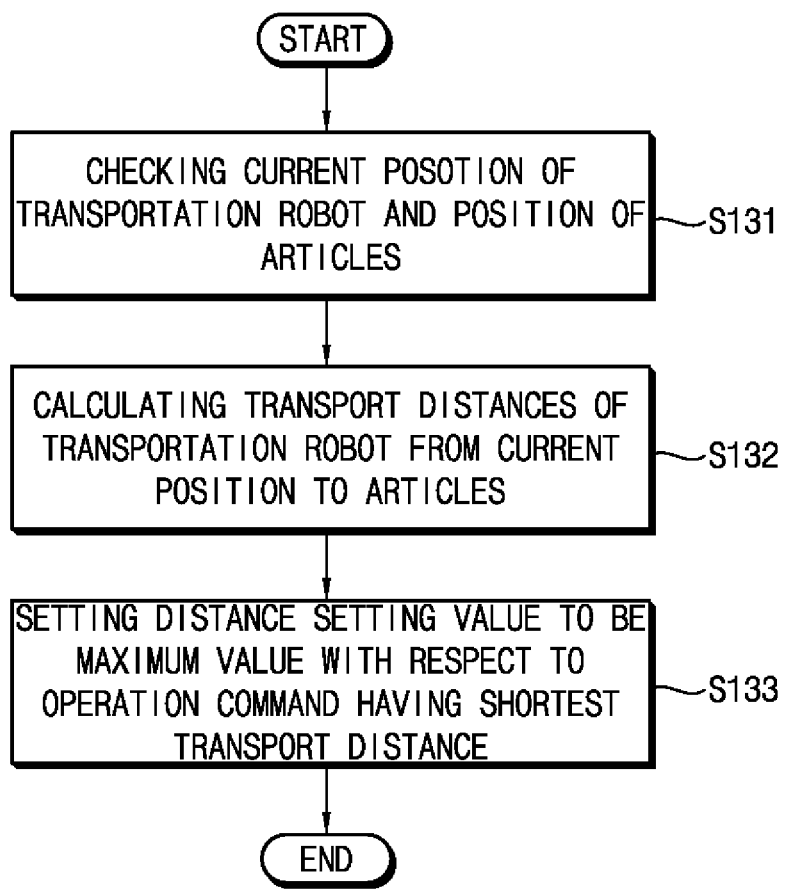

ARTICLE STORAGE DEVICE, METHOD OF CALCULATING SETTING VALUE IN ORDER OF PRIORITY OF THE ARTICLE STORAGE DEVICE, AND METHOD OF STORING ARTICLE USING THE SAME

CROSS-REFERENCE TO RELATED APPLICATION

This application claims priority to Korean Patent Application No. 10-2020-0076686, filed on Jun. 23, 2020 and all the benefits accruing therefrom under 35 U.S.C. § 119, the contents of which are incorporated by reference in their entirety.

TECHNICAL FIELD

The present disclosure relates to an article storage device, a method of calculating a setting value in order of priority of the article storage device, and a method of storing article using the same. More particularly, the present disclosure relates to an article storage device capable of storing a plurality of articles, a method of calculating a setting value in order of priority of the article storage device, and a method of storing article using the same.

BACKGROUND

An article storage device stores articles capable of performing semiconductor manufacturing processes such as a deposition process, an exposure process, an etching process, a cleaning process, etc. Examples of the articles include a front opening unified pod (FOUP), a front opening shipping box (FOSB), a magazine, a reticle port, etc. A wafer, a printed circuit board, a reticle, etc., may be loaded on the article.

The article storage device may include a load port on which the articles are loaded and unloaded, a plurality of shelves on which the articles are loaded, and a transportation robot which transfer the articles between the load port and the shelves.

In the article storage device, the transportation robot transports the articles based on a transportation command of an upper system. The transportation robot does not consider other factors such as a distance the transportation robot moves to the articles, but only transfers the articles by the transportation command. Thus, the distance the transportation robot moves to the articles may be increased.

Therefore, transportation efficiency of the transportation robot may be deteriorated in the article storage device.

SUMMARY

The example embodiments of the present invention provides an article storage device capable of improving transportation efficiency of a transportation robot.

The example embodiments of the present invention provides a method of calculating a setting value in order of priority of the article storage device.

The example embodiments of the present invention provides a method of storing article using the same.

According to one exemplary embodiment of the present invention, an article storage device includes a load port configured to load and unload a plurality of articles, a plurality of shelves configured to load the articles, a transportation robot configured to transport the articles between the load port and the shelves, a receiving part configured to receive operation commands of the transportation robot from an upper system, a calculating part configured to calculate a setting value of an order of priority with respect to the operation commands, and a control part configured to control the transportation robot to perform an operation command having a high setting value of an order of priority among the operation commands.

In one exemplary embodiment, the calculating part may check a basic setting value with respect to an order of priority on the operation commands, which is predetermined by the upper system, and may calculate a time setting value based on a time for transmitting the operation commands from the upper system, and may sum the basic setting value and the time setting value.

In one exemplary embodiment, the calculating part may calculate a distance setting value based on a transport distance for the transportation robot to perform the operation commands, and may additionally sum the distance setting value.

In one exemplary embodiment, the calculating part may check a current position of the transportation robot and a position of each of the articles for each of the operation commands, and may calculate the transport distances from the current position of the transportation robot to a position of the articles, and sets the distance setting value to be a maximum value with respect to an operation command having the shortest transport distance among the operation commands, and may set the distance setting value to be a minimum value with respect to remaining operation commands.

According to one exemplary embodiment of the present invention, a method of calculating a setting value of order of priority with respect to operation commands transmitted from an upper system to transport articles between a load port and shelves or between the shelves by a transportation robot of an article storage device is provided as follows. A basic setting value is checked with respect to an order of priority which is predetermined to the operation commands by the upper system. A time setting value is calculated based on a time at which the operation commands are transmitted from the upper system. The basic setting value and the time setting value are summed.

In one exemplary embodiment, the time setting value may be calculated by adding the time setting value of a predetermined amount when a predetermined time has passed from a time at which the operation commands are transmitted.

In one exemplary embodiment, the time setting value may be calculated by repeatedly adding the time setting value of a predetermined amount when a predetermined period has passed from a time at which the operation commands are transmitted.

In one exemplary embodiment, the time setting value may be calculated by immediately adding the time setting value of a predetermined amount when the operation commands are transmitted.

In one exemplary embodiment, the method of calculating the setting value of the order of priority may further include calculating a distance setting value based on a transport distance for the transportation robot to perform the operation commands.

In one exemplary embodiment, the distance setting value may be calculated by checking a current position of the transportation robot and a position of each of the articles for each of the operation commands; calculating transport distances of the transportation robot from the current position of the transportation robot to the position of the articles; and setting the distance setting value to be maximum value with respect to an operation command having a shortest transport distance among the operation commands, and setting the distance setting value to be minimum with respect to remaining operation commands.

In one exemplary embodiment, the transport distances may be sum of a squared value of a horizontal transport distance of the transportation robot from the current position to the position of the articles and a squared value of a vertical transport distance of the transportation robot from the current position to the position of the articles.

In one exemplary embodiment, the transport distances may be sum of the horizontal transport distance of the transportation robot from the current position to the position of the articles and the vertical transport distance of the transportation robot from the current position to the position of the articles.

In one exemplary embodiment, the calculating the time setting value and the calculating the distance setting value may be selectively added.

In one exemplary embodiment, a minimum value of the basic setting value and a minimum value of the time setting value may be greater than a maximum value of the distance setting value, and the basic setting value and the time setting value may have greater effect than the distance setting value among the setting values of the order of priority.

In one exemplary embodiment, each of the basic setting value and the time setting value may be multiplied by a constant, and the minimum value of the basic setting value and the minimum value of the time setting value may be greater than the maximum value of the distance setting value.

In one exemplary embodiment, ranges of the basic setting value, the time setting value, and the distance setting value may be adjusted, and the minimum value of the basic setting value and the minimum value of the time setting value may be greater than the maximum value of the distance setting value.

According to one exemplary embodiment of the present invention, a method of transporting articles is provided as follows. Operation commands are received from an upper system to transport articles between a load port and a plurality of shelves or between the shelves by a transportation robot. A setting value of an order of priority is calculated with respect to the operation commands. An operation command having a highest setting value of an order of priority is selected among the operation commands. The selected operation command is performed using the transportation robot. The setting value of the order of priority is calculated by checking a basic setting value with respect to a predetermined order of priority by the upper system; setting a time setting value based on a time at which the operation commands are transmitted from the upper system; and summing the setting values.

In one exemplary embodiment, the operation commands may be performed in an order received from the upper system, when the setting values of the order of priority are the same with respect to the operation commands.

In one exemplary embodiment, the setting value of the order of priority, which includes added operation commands, may be calculated again to include, when the operation commands are additionally transmitted from the upper system.

In one exemplary embodiment, existence of the remaining operation commands may be checked when the selected operation command is performed, and when the remaining operation commands exists, the setting value of the order of priority may be recalculated with respect to the remaining operation commands.

According to the present invention, the basic setting value, the time setting value, and the distance setting value are summed, and the setting value of the order of priority for the operation commands is calculated. Since the time setting value is summed, delayed performance, in which some operation commands are performed with a long delay, may be prevented. Also, since the distance setting value is summed, the distance that the transportation robot moves to the article may be shortened. Thus, the transportation efficiency of the transportation robot may be improved.

According to the present invention, the minimum value of the basic setting value and the minimum value of the time setting value may be greater than the maximum value of the distance setting value, and thus, the transportation robot may be affected relatively greater by the basic setting value and the time setting value than the distance setting value in the setting values of the order of priority. Therefore, poor transportation, in which only some articles adjacent to the transportation robot are transported by the transportation robot, may be prevented.

BRIEF DESCRIPTION OF THE DRAWINGS

Exemplary embodiments can be understood in more detail from the following description taken in conjunction with the accompanying drawings, in which:

FIG. 2 is a flow chart illustrating a method of storing articles using the article storage device shown in FIG. 1;

FIG. 3 is a flow chart illustrating a method of calculating the order of priority of operation commands shown in FIG. 2; and FIG. 4 is a flow chart illustrating a method of calculating a distance setting value shown in FIG. 3.

DETAILED DESCRIPTION OF EMBODIMENTS

Figure 1:
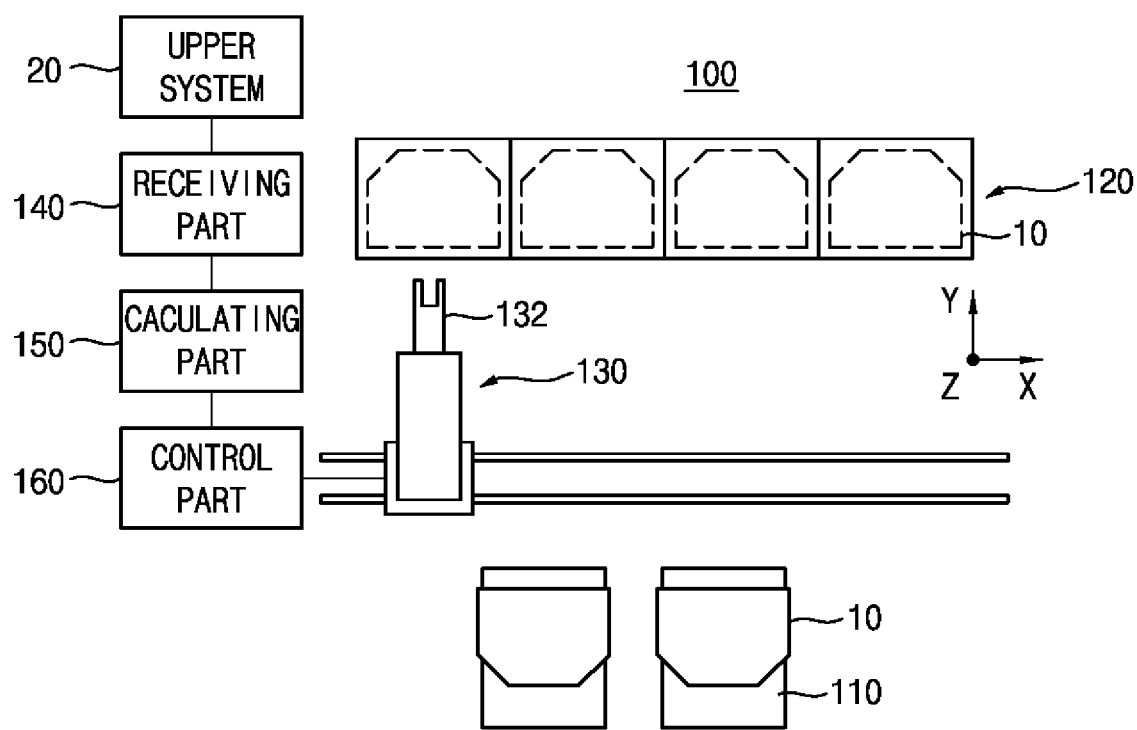
FIG. 1 is a brief plan view illustrating an article storage device according the one exemplary embodiment of the present invention.

Hereinafter, embodiments of the present invention will be described in detail with reference to enclosed drawings. It is important to understand that the present invention may be embodied in many alternative forms and should not be construed as limited to the example embodiments set forth herein. While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. In describing each drawing, like numerals are used for like elements. In the enclosed drawings, the sizes and relative sizes of layers and regions may be exaggerated for clarity. Like numerals refer to like elements throughout.

It will be understood that, although the terms first, second, etc. may be used herein to describe various elements, these elements should not be limited by these terms. These terms are used to distinguish one element from another. For example, a first element discussed below could be termed a second element without departing from the teachings of the present inventive concept. Also, a second element discussed below could be termed a first element without departing from the teachings of the present inventive concept.

The terms used in the present invention is only used to describe particular embodiments, and it is not intended to limit the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a brief plan view illustrating an article storage device according the one exemplary embodiment of the present invention;

Referring to FIG. 1, the article storage device 100 may include a load port 110, a plurality of shelves 120, a transportation robot 130, a receiving part 140, a calculating part 150, and a control part 160.

The articles 10 may be loaded on the load port 110 or unloaded from the load port 110. The articles 10 may be transported by an additional transportation unit (not shown).

The articles 10 may include a front opening unified pod (FOUP), a front opening shipping box (FOSB), a magazine, a reticle pod, etc. A semiconductor substrate, a printed circuit board, a reticle etc., may be loaded in the articles 10.

A plurality of alignment pins (not shown) may be provided on an upper surface of the load port 110. A plurality of alignment recess (not shown) may be provided on a lower surface of the articles 10. When the articles 10 are placed on the load port 110, the alignment pins (not shown) may be received in the alignment recesses (not shown), and thus, may articles 10 may be correctly placed on the load port 110.

In the load port 110, the articles 10 may be alternately loaded and unloaded in one port. Alternatively, the load port 110 may include a loading port configured to load the articles 10 and an unloading port configured to unload the articles 10.

The articles 10 may be loaded on the shelves 120. The shelves 120 may be aligned in an X-direction which is a right and left direction and in a Z-direction which is an up and down direction. The shelves 120 may be aligned in one row, or in a two rows which are substantially parallel with each other.

The transportation robot 130 is disposed between the load port 110 and the shelves 120, and transports the articles 10 between the load port 110 and the shelves 120. The transportation robot 130 may transport the articles 10 between the shelves 120.

The transportation robot 130 may move in the X-direction, and in the Z-direction and rotate to transport the articles 10. Although not shown in FIG. 1, the transportation robot 130 may include an X-direction driving part (not shown) configured to move the transportation robot 130 in the X-direction, a Z-direction driving part (not shown) configured to move the transportation robot 130 in the Z-direction, and a rotation driving part (not shown) configured to rotate the transportation robot 130.

Also, the transportation robot 130 may include a robot arm 132 configured to transport the articles 10, and the robot arm 132 may be transported toward the shelves 120. The robot arm 132 may grip and transport the articles 10.

For example, the robot arm 132 may be configured to move in a Y-direction which is a backward and forward direction. The transportation robot 130 may include a Y-direction driving part (not shown) configured to transport the robot arm 132. The robot arm 132 may include a multi joint robot arm which is extendable and shrinkable.

For example, each of the X-direction driving part, the Y-direction driving part, the Z-direction driving part, and the rotation driving part may include a power transmission unit having a motor, a timing belt, pulleys, etc.

Thus, the transportation robot 130 may place the articles 10 on the load port 110, or may transport the articles 10 placed on the load port 110. Also, the transportation robot 130 may load the articles 10 on the shelves 120, or may unload the articles 10 from the shelves 120.

Alternatively, a plurality of the transportation robots 130 may be prepared to rapidly transport the articles 10.

Meanwhile, a teaching sensor (not shown) may be prepared on an upper surface of the transportation robot 130. The teaching sensor (not shown) may include a photo sensor.

The sensor (not shown) may irradiate a light toward a reflecting plate (not shown) disposed on a rear surface of each of the shelves 120, and receive a reflection light reflected from the reflecting plate (not shown), and thus, sense location of each of the shelves 120.

Also, since the transportation robot 130 is transportable in the X-direction and the Z-direction, the location of each of the shelves 120 may be sensed by the sensor (not shown) and the reflecting plate (not shown). Therefore, the transportation robot 130 may securely load the articles 10 on the shelves 120 or may securely unload the articles 10 from the shelves 120.

The receiving part 140 received operation commands of the transportation robot 130 from an upper system 20. The operation commands may include position information of the articles 10 to be transported, position information of transport destination of the articles 10, and basic setting values for the order of priority for the operation commands, which is predetermined by the upper system 20.

The calculating part 150 calculates the setting value of the order of priority for the operation commands.

In particular, the calculating part 150 may sum the basic setting value, the time setting value, and the distance setting value, and calculate the setting value of the order of priority.

The calculating part 150 may selectively sum the time setting value and the distance setting value during calculating the setting value of the order of priority. Also, the calculating part 150 may calculate the setting value of the order of priority without the time setting value and the distance setting value.

Since the basic setting value is predetermined in the operation commands, the calculating part 150 may easily recognize the basic setting value from the information in the operation commands.

The time setting value may be calculated based on the time for which the operation commands are transmitted from the upper system 20.

For example, when a predetermined time has passed from the time at which the operation commands are transmitted to the receiving part 140, the time setting value having a predetermined amount may be added to calculate the time setting value by the calculating part 150.

The method of calculating the time setting value may be variously used.

In another exemplary embodiment of the present invention, the time setting value having a predetermined amount may be repeatedly added to a time when a predetermined period has passed from the time at which the operation commands are transmitted to the receiving part 140, and thus, the calculating part 150 may calculate the time setting value.

The method of calculating the time setting value may be used when a transporting operation of the transportation robot 130 is congested and previously transmitted the operation command is need to be previously performed.

In one another exemplary embodiment of the present invention, the time setting value having a predetermined time may be immediately added when the operation commands are transmitted to the receiving part 140, and the calculating part 150 may calculate the time setting value.

The method of calculating the time setting value may be used when operation commands which is currently transmitted to the receiving part 140 is need to be performed earlier.

The distance setting value may be calculated based on a transport distance by which the transportation robot 130 is transported to perform the operation commands.

In particular, the calculating part 150 checks a current position of the transport robot 130 and a position of the articles 10 to be operated by each of the operation commands.

The current position of the transportation robot 130 may be checked using operation information of each driving parts configured to operate the transportation robot 130. The position of the articles 10 may be checked using position information of each of the shelves 120 or position information of the load port 110.

Also, the calculating part 150 may calculate the transport distances from the current position to the position of the articles 10.

For example, the transport distances may be sum of squared value of a distance in the X-direction distance, which is a horizontal transport distance of the transportation robot 130 from the current position to the position of the articles 10, and a distance in the Z-direction distance, which is a vertical direction of the transportation robot 130 from the current position to the position of the articles 10.

According to Pythagoras theorem, the sum of the squared value of the distance in the X-direction and the squared value of the distance in the Z-direction are the same as a squared value of a straight distance from the current position to the position of the articles 10, and the transport distances may be the straight distance from the current position to the position of the articles 10. Thus, when the transportation robot 130 moves in both direction of the X-direction and the Z-direction, the method of calculating the transport distance may be used.

In another exemplary embodiment, the transport distances may be sum of the distance in the X-direction, which is the horizontal transport distance of the transportation robot 130 from the current position to the position of the articles 10, and the distance in the Z-direction, which is the vertical transport distance of the transportation robot 130 from the current position to the position of the articles 10.

When the transportation robot 130 moves in the X-direction and then moves in the Z-direction, the method of calculating the transport distance may be used.

When the transport distances are calculated, the calculating part 150 may set the distance setting value to be a maximum value with respect to an operation command having shortest transport distance among the operation commands, and set the distance setting value to be a minimum value with respect to remaining operation commands.

The calculating part 150 performs setting the distance setting value with respect to the operation command having the shortest transport distance among the operation commands, and thus, the excessive effect of the distance setting value may be prevented in the calculation of the order of priority. Thus, poor transportation, in which only some articles 10 adjacent to the transportation robot 130 are transported by the transportation robot 130, may be prevented.

Alternatively, when the calculating part 150 sets the distance setting value in inverse proportion to the calculated transport distances, the calculating part 150 may set the distance setting value to be greater than the minimum value with respect to the remaining operation command. Thus, the distance setting value may have greater effect in the calculation of the setting value of the order of priority. Therefore, the transportation robot 130 may repeatedly transport only the articles 10 adjacent to the transportation robot 130.

Meanwhile, the minimum value of the basic setting value and the minimum value of the time setting value may be greater than the maximum value of the distance setting value. Thus, the basic setting value and the time setting value may affect greater than the distance setting value in the setting value of the order of priority.

In particular, the calculating part 150 may multiply each of the basic setting value and the time setting value by a constant, so that the minimum value of the basic setting value and the minimum value of the time setting value are greater than the maximum value of the distance setting value.

Alternatively, ranges of the basic setting value, the time setting value, and the distance setting value may be adjusted, so that the minimum value of the basic setting value and the minimum value of the time setting value are greater than the maximum value of the distance setting value.

Here, the range of the basic setting value may be set by the upper system 20, and the ranges of the time setting value and the distance setting value may be set by the calculating part 150.

The control part 160 receives the calculation result of the setting value of the order of priority calculated by the calculating part 150 for the operation commands, and selects an operation command having the highest setting value of the order of priority among the operation commands. Then, the control part 160 controls the transportation robot 130 to perform the selected operation command.

The article storage device 100 according to the exemplary embodiment of the present invention sums the time setting value during calculating the order of priority, and thus, delayed performance, in which some operation commands are performed with a long delay, may be prevented. Also, since the article storage device 100 sums the distance setting value in the calculation of the order of the priority, the transport distance that the transportation robot 130 moves to the article 10 may be shortened. Thus, transportation efficiency of the transportation robot 130 may be improved.

FIG. 2 is a flow chart illustrating a method of storing articles using the article storage device shown in FIG. 1. FIG. 3 is a flow chart illustrating a method of calculating the order of priority of operation commands shown in FIG. 2.

FIG. 4 is a flow chart illustrating a method of calculating a distance setting value shown in FIG. 3.

Referring to FIGS. 2 to 4, the method of storing the articles will be explained as follows.

Firstly, the operation commands for transporting the articles 10 between the load port 110 and the shelves 120 or between the shelves 120 by the transportation robot 130 of the article storage device 100 is received from the upper system 20 (S100).

In particular, the receiving part 140 of the article storage device 100 may receive the operation commands transmitted from the upper system 20.

The operation commands may include the position information of the articles 10 to be transported, the position information of the transport destination of the articles 10, and the basic setting values for the order of priority for the operation commands, which is predetermined by the upper system 20.

The setting value of the order of priority is calculated with respect to the operation commands (S200).

The calculation of the setting value of the order of priority may be performed by the calculating part 150 of the article storage device 100.

The method of calculating the order of priority with reference to FIG. 3 is as follows.

Firstly, the basic setting value is checked (S110).

Since the basic setting value is predetermined by the operation commands, the calculating part 150 may easily check the basic setting value from the information included in the operation command.

Then, the time setting value, which is transmitted from the upper system 20 by the time for transmitting the operation commands, is calculated (S120).

For example, when a predetermined time has passed from a time at which the operation commands are transmitted to the receiving part 140, the time setting value having a predetermined time is added, and the calculating part 150 may calculate the time setting value.

The calculation of the time setting value may be generally used.

In another exemplary embodiment of the present invention, the time setting value having a predetermined amount may be repeatedly added to a time when a predetermined period has passed from the time at which the operation commands are transmitted to the receiving part 140, and thus, the calculating part 150 may calculate the time setting value.

The method of calculating the time setting value may be used when the transporting operation of the transportation robot 130 is congested and previously transmitted the operation command is need to be previously performed.

In another exemplary embodiment, when the operation commands are transmitted to the receiving part 140, the time setting value having a predetermined amount is added, and the calculating part 150 may calculate the time setting value.

The calculation of the time setting value may be used when the operation commands of the transmission to the receiving part 140 is need to be previously performed.

Then, the distance setting value is calculated based on the transport distance, by which the transportation robot 130 is transported to performed the operation commands (S130).

With reference to FIG. 4, the method of calculating the distance setting value is as follows.

Firstly, the current position of the transportation robot 130 and the position of the articles 10 to be operated by each of the operation commands are checked (S131).

The current position of the transportation robot 130 may be checked using the operation information of the driving parts configured to drive the transportation robot 130. The position of the articles 10 may be checked using the position information of each of the shelves 120 or position information of the load port 110.

Then, the transport distances from the current position to the position of the articles 10 are calculated (S132).

The calculating part 150 may calculate the transport distances using the current position of the transportation robot 130 and the position of the articles 10.

For example, the transport distances may be the sum of squared value of the distance in the X-direction distance, which is the horizontal transport distance of the transportation robot 130 from the current position to the position of the articles 10, and the distance in the Z-direction distance, which is the vertical direction of the transportation robot 130 from the current position to the position of the articles 10.

According to Pythagoras theorem, the sum of the squared value of the distance in the X-direction and the squared value of the distance in the Z-direction are the same as the squared value of the straight distance from the current position to the position of the articles 10, and thus, the transport distances may be the straight distance from the current position to the position of the articles 10. Thus, when the transportation robot 130 moves in both direction of the X-direction and the Z-direction, the method of calculating the transport distance may be used.

In another exemplary embodiment, the transport distances may be the sum of the distance in the X-direction, which is the horizontal transport distance of the transportation robot 130 from the current position to the position of the articles 10, and the distance in the Z-direction, which is the vertical transport distance of the transportation robot 130 from the current position to the position of the articles 10.

When the transportation robot 130 moves in the X-direction and then moves in the Z-direction, the method of calculating the transport distance may be used.

When the transport distances are calculated, the calculating part 150 sets the distance setting value to be the maximum value with respect to the operation command having shortest transport distance among the operation commands, and set the distance setting value to be a minimum value with respect to remaining operation commands (S133).

The calculating part 150 performs setting the distance setting value with respect to the operation command having the shortest transport distance among the operation commands, and thus, the excessive effect of the distance setting value may be prevented in the calculation of the order of priority. Thus, poor transportation, in which only some articles 10 adjacent to the transportation robot 130 are transported by the transportation robot 130, may be prevented.

Alternatively, when the calculating part 150 sets the distance setting value in inverse proportion to the calculated transport distances, the calculating part 150 may set the distance setting value to be greater than the minimum value with respect to the remaining operation command. Thus, the distance setting value may have greater effect in the calculation of the setting value of the order of priority. Therefore, the transportation robot 130 may repeatedly transport only the articles 10 adjacent to the transportation robot 130.

Referring again to FIG. 3, the basic setting value, the time setting value, and the distance setting value are summed (S140).

The calculating part 150 may sum the basic setting value, the time setting value, and the distance setting value, and calculate the setting value of the order of priority.

Meanwhile, the step (S120) of calculating the time setting value and the step (S130) of calculating the distance setting value may be selectively added.

In particular, the calculating part 150 may selectively sum the time setting value and the distance setting value during calculating the setting value of the order of priority. Also, the calculating part 150 may calculate the setting value of the order of priority except the time setting value and the distance setting value.

Also, the minimum value of the basic setting value and the minimum value of the time setting value may be greater than the maximum value of the distance setting value. Since the basic setting value and the time setting vale may affect the order of priority greater than the distance setting value in the setting value of the order of priority, the setting value of the order of priority of the operation commands having the short transport distance of the transportation robot 130 may be relatively small. Therefore, the poor transportation, in which only some operation command for transporting some articles 10 adjacent to the transportation robot 130, may be prevented.

Meanwhile, when the distance setting value affects relatively greater than the basic setting value and the time setting value, the setting value of the order of priority corresponding to the operation command having short transport distance of the transportation robot 130 may be great. Thus, the transportation robot 130 may repeatedly perform the operation command having the short transport distance of the transportation robot 130.

In particular, the calculating part 150 may multiply each of the basic setting value and the time setting value by a constant, so that the minimum value of the basic setting value and the minimum value of the time setting value are greater than the maximum value of the distance setting value.

Alternatively, ranges of the basic setting value, the time setting value, and the distance setting value may be adjusted, so that the minimum value of the basic setting value and the minimum value of the time setting value are greater than the maximum value of the distance setting value.

Here, the range of the basic setting value may be set by the upper system 20, and the ranges of the time setting value and the distance setting value may be set by the calculating part 150.

Referring again to FIG. 2, the operation command having the highest setting value of the order of the priority among the operation commands is selected (S300).

In particular, the control part 160 receives the calculation result of the setting value of the order of priority calculated by the calculating part 150 for the operation commands, and selects the operation command having the highest setting value of the order of priority among the operation commands.

The transportation robot 130 performs the selected operation command (S400).

In particular, the control part 160 controls the transportation robot 130 to perform the operation command selected by the transportation robot 130.

Also, when the setting values of the order of priority is same with respect to the operation commands, the control part 160 may perform the operation commands with respect to the receiving order from the upper system 20. That is, the control part 160 performs the firstly received operation command, which is transmitted from the upper system 20 among the operation commands having the same setting value of the order of priority.

When the selected operation command is performed, the remaining operation commands are checked to be remained in the receiving part 140 (S500).

When the remaining operation commands remains in the receiving part 140, the calculating part 150 calculates the setting value of the order of priority again with respect to the remaining operation commands (S200).

Also, when the operation commands are additionally transmitted to the receiving part 140 from the upper system 20, the calculating part 150 may calculate the setting value of the order of priority with respect to the operation commands including the additionally operation commands again.

According to the method of the storing articles of the present invention, when the setting value of the order of priority is calculated, the time setting value is summed, and the delayed performance, in which some operation commands are performed with a long delay, may be prevented. Also, in the method of storing the articles, since the distance setting value is summed in calculating the setting value of the order of priority, the transport distance that the transportation robot 130 moves to the article 10 may be shortened. Thus, the transportation efficiency of the transportation robot 130 may be improved.

According to the exemplary embodiments of the present invention, the basic setting value, the time setting value, and the distance setting value are summed, and the setting value of the order of priority for the operation commands is calculated. Since the time setting value is summed, the delayed performance, in which some operation commands are performed for a long time, may be prevented. Also, since the distance setting value is summed, the distance of transporting that the transportation robot 130 moves to the article 10 may be shortened. Thus, the transportation efficiency of the transportation robot 130 may be improved.

The minimum value of the basic setting value and the minimum value of the time setting value may be greater than the maximum value of the distance setting value, and thus, the transportation robot 130 may be affected relatively greater by the basic setting value and the time setting value than the distance setting value in the setting values of the order of priority. Therefore, poor transportation, in which only some articles 10 adjacent to the transportation robot 130 are transported by the transportation robot 130, may be prevented.

Although the example embodiments of the present invention have been described with reference to the specific embodiments, they are not limited thereto. Therefore, it will be readily understood by those skilled in the art that various modifications and changes can be made thereto without departing from the spirit and scope of the appended claims.

What is claimed is:

1. A semiconductor manufacturing article storage device comprising:
    a load port configured to load and unload a plurality of articles;
    a plurality of shelves configured to load the articles;
    a transportation robot configured to transport the articles between the load port and the shelves or between the shelves;
    a receiving part configured to receive operation commands of the transportation robot from an upper system;

a calculating part configured to calculate a setting value of an order of priority with respect to the operation commands; and a control part configured to control the transportation robot to perform an operation command having a high setting value of an order of priority among the operation commands wherein the calculating part checks a basic setting value with respect to an order of priority on the operation commands, which is predetermined by the upper system, and calculates a time setting value based on a time for transmitting the operation commands from the upper system, and sums the basic setting value and the time setting value.

2. The semiconductor manufacturing article storage device of claim 1, wherein the calculating part calculates a distance setting value based on a transport distance for the transportation robot to perform the operation commands, and additionally sums the distance setting value.

3. The semiconductor manufacturing article storage device of claim 2, wherein the calculating part checks a current position of the transportation robot and a position of each of the articles for each of the operation commands, and calculates the transport distances from the current position of the transportation robot to a position of the articles, and sets the distance setting value to be a maximum value with respect to an operation command having the shortest transport distance among the operation commands, and sets the distance setting value to be a minimum value with respect to remaining operation commands.

4. A method of calculating a setting value of order of priority with respect to operation commands transmitted from an upper system to transport articles between a load port and shelves or between the shelves by a transportation robot of a semiconductor manufacturing article storage device, comprising:
checking a basic setting value with respect to an order of priority which is predetermined to the operation commands by the upper system;
calculating a time setting value based on a time at which the operation commands are transmitted from the upper system; and
summing the basic setting value and the time setting value.

5. The method of claim 4, wherein the time setting value is calculated by adding the time setting value of a predetermined amount when a predetermined time has passed from a time at which the operation commands are transmitted.

6. The method of claim 4, wherein the time setting value is calculated by repeatedly adding the time setting value of a predetermined amount when a predetermined period has passed from a time at which the operation commands are transmitted.

7. The method of claim 4, wherein the time setting value is calculated by immediately adding the time setting value of a predetermined amount when the operation commands are transmitted.

8. The method of claim 4, further comprising calculating a distance setting value based on a transport distance for the transportation robot to perform the operation commands.

9. The method of claim 8, wherein the distance setting value is calculated by:
checking a current position of the transportation robot and a position of each of the articles for each of the operation commands;
calculating transport distances of the transportation robot from the current position of the transportation robot to the position of the articles; and
setting the distance setting value to be maximum value with respect to an operation command having a shortest transport distance among the operation commands, and setting the distance setting value to be minimum with respect to remaining operation commands.

10. The method of claim 9, wherein the transport distances are sum of a squared value of a horizontal transport distance of the transportation robot from the current position to the position of the articles and a squared value of a vertical transport distance of the transportation robot from the current position to the position of the articles.

11. The method of claim 9, wherein the transport distances are sum of the horizontal transport distance of the transportation robot from the current position to the position of the articles and the vertical transport distance of the transportation robot from the current position to the position of the articles.

12. The method of claim 8, wherein the calculating the time setting value and the calculating the distance setting value are selectively added.

13. The method of claim 8, wherein a minimum value of the basic setting value and a minimum value of the time setting value are greater than a maximum value of the distance setting value, and the basic setting value and the time setting value have greater effect than the distance setting value among the setting values of the order of priority.

14. The method of claim 13, wherein each of the basic setting value and the time setting value is multiplied by a constant, and the minimum value of the basic setting value and the minimum value of the time setting value are greater than the maximum value of the distance setting value.

15. The method of claim 13, wherein ranges of the basic setting value, the time setting value, and the distance setting value are adjusted, and the minimum value of the basic setting value and the minimum value of the time setting value are greater than the maximum value of the distance setting value.

16. A method of transporting semiconductor manufacturing articles, comprising:
receiving operation commands from an upper system to transport articles between a load port and a plurality of shelves or between the shelves by a transportation robot;
calculating a setting value of an order of priority with respect to the operation commands;
selecting an operation command having a highest setting value of an order of priority among the operation commands; and
performing the selected operation command using the transportation robot,
wherein the setting value of the order of priority is calculated by:
checking a basic setting value with respect to a predetermined order of priority by the upper system;
setting a time setting value based on a time at which the operation commands are transmitted from the upper system; and
summing the basic setting value and the time setting value.

17. The method of claim 16, wherein the operation commands are performed in an order received from the upper system, when the setting values of the order of priority are the same with respect to the operation commands.

18. The method of claim 16, wherein the setting value of the order of priority, which includes added operation commands, are calculated again to include, when the operation commands are additionally transmitted from the upper system.

19. The method of claim 16, wherein existence of the remaining operation commands are checked when the selected operation commands are performed, and when the remaining operation commands exists, the setting value of the order of priority is recalculated with respect to the remaining operation commands.

\* \* \* \* \*